United States Patent
Zhang et al.

(10) Patent No.: US 11,983,110 B2
(45) Date of Patent: May 14, 2024

(54) STORAGE CIRCUIT, CHIP, DATA PROCESSING METHOD, AND ELECTRONIC DEVICE

(71) Applicant: Lemon Inc., Grand Cayman (KY)

(72) Inventors: Junmou Zhang, Los Angeles, CA (US); Dongrong Zhang, Beijing (CN); Shan Lu, Los Angeles, CA (US); Jian Wang, Beijing (CN)

(73) Assignee: Lemon Inc., Grand Cayman (KY)

( * ) Notice: Subject to any disclaimer, the term of this patent is extended or adjusted under 35 U.S.C. 154(b) by 18 days.

(21) Appl. No.: 17/850,559

(22) Filed: Jun. 27, 2022

(65) Prior Publication Data

US 2023/0004490 A1    Jan. 5, 2023

(30) Foreign Application Priority Data

Jul. 2, 2021    (CN) .......................... 202110750668.8

(51) Int. Cl.
*G06F 12/08* (2016.01)
*G06F 12/0802* (2016.01)

(52) U.S. Cl.
CPC ................................ *G06F 12/0802* (2013.01)

(58) Field of Classification Search
CPC .................................................. G06F 12/0802
USPC ......................................................... 711/104
See application file for complete search history.

(56) References Cited

U.S. PATENT DOCUMENTS

| 2005/0005053 | A1* | 1/2005 | Jang | G11C 7/1075 |
| | | | | 711/1 |
| 2011/0103159 | A1 | 5/2011 | Noorlag | |
| 2012/0069684 | A1 | 3/2012 | Douzaka et al. | |
| 2012/0250439 | A1* | 10/2012 | Noorlag | G11C 7/04 |
| | | | | 365/202 |

(Continued)

FOREIGN PATENT DOCUMENTS

| CN | 1577609 A | 2/2005 |
| CN | 102119421 A | 7/2011 |

(Continued)

OTHER PUBLICATIONS

Zhang et al.; "SRAM Stability Analysis and Performance-Reliability Tradeoff for Different Cache Configurations"; IEEE Transactions on Very Large Scale Integration Systems (VLSI); vol. 28 No. 3; Mar. 2020; p. 620-633.

(Continued)

*Primary Examiner* — Christopher B Shin
(74) *Attorney, Agent, or Firm* — BakerHostetler

(57) ABSTRACT

A storage circuit, a chip, a data processing method, and an electronic device are disclosed. The storage circuit includes: an input control circuit and a memory. The input control circuit is configured to: receive n input data and an input control signal; perform first data processing on the n input data based on the input control signal to obtain n intermediate data corresponding to the n input data one by one; and write the n intermediate data and a sign signal corresponding to the n input data into the memory; the memory is configured to store the n intermediate data and the sign signal; different values of the sign signal respectively represent different processing processes of the first data processing, and n is a positive integer.

20 Claims, 3 Drawing Sheets

(56) References Cited

U.S. PATENT DOCUMENTS

2015/0134989 A1* 5/2015 Chun .................. G11C 7/1009
713/323
2019/0034096 A1 1/2019 Simons et al.

FOREIGN PATENT DOCUMENTS

CN 105706168 A 6/2016
DE 102006061359 A1 7/2008

OTHER PUBLICATIONS

Gebregiorgis et al.; "Aging Mitigation in Memory Arrays Using Self-controlled Bit-flipping Technique"; IEEE The 20th Asia and South Pacific Design Automation Conference; 2015; p. 231-236.
Ganapathy et al.; "iRMW : A Low-Cost Technique to Reduce NBTI-Dependent Parametric Failures in L1 Data Caches"; IEEE 32nd International Conference on Computer Design (ICCD); 2014; p. 68-74.
Gebregiorgis; "Aging Mitigation Schemes for Embedded Memories"; Delft University of Technology; Computer Engineering; MSc Thesis; 2014; 91 pages.
International Patent Application No. PCT/SG2022/050409; Int'l Search Report; dated Jan. 30, 2023; 3 pages.

* cited by examiner

STORAGE CIRCUIT, CHIP, DATA PROCESSING METHOD, AND ELECTRONIC DEVICE

CROSS-REFERENCE TO RELATED APPLICATION

The present application claims priority of Chinese Patent Application No. 202110750668.8, filed on Jul. 2, 2021, and the entire content disclosed by the Chinese patent application is incorporated herein by reference as part of the present application for all purposes under the U.S. law.

TECHNICAL FIELD

The embodiments of the present disclosure relate to a storage circuit, a chip, a data processing method, and an electronic device.

BACKGROUND

Cache is a kind of memory located between the central processing unit (CPU) and the dynamic random access memory (DRAM) of the chip. The size of the cache is small, but the cache can run very fast. Usually, the cache is composed of the static random access memory (SRAM).

SUMMARY

This content section is provided to introduce ideas in a simplified form, these ideas will be described in detail in the following detailed description section. This content is not intended to identify key features or essential features of the claimed technical solution, nor is it intended to limit the scope of the claimed technical solution.

At least one embodiment of the present disclosure provides a storage circuit, which comprises: an input control circuit and a memory. The input control circuit is configured to: receive n input data and an input control signal; perform first data processing on the n input data based on the input control signal to obtain n intermediate data corresponding to the n input data one by one; and write the n intermediate data and a sign signal corresponding to the n input data into the memory; the memory is configured to store the n intermediate data and the sign signal; different values of the sign signal respectively represent different processing processes of the first data processing, and n is a positive integer.

At least one embodiment of the present disclosure further provides a chip comprising the storage circuit according to any one of the above embodiments.

At least one embodiment of the present disclosure further provides a data processing method, which is applied to the storage circuit described in any embodiment of the present disclosure and comprises: receiving the n input data and the input control signal; performing the first data processing on the n input data based on the input control signal to obtain the n intermediate data corresponding to the n input data one by one; and storing the n intermediate data and the sign signal corresponding to the n input data. n is a positive integer.

At least one embodiment of the present disclosure further provides an electronic device comprising: a processing apparatus. The processing apparatus includes the storage circuit according to any one of the above embodiments.

BRIEF DESCRIPTION OF THE DRAWINGS

The above and other features, advantages, and aspects of various embodiments of the present disclosure will become more apparent when taken in conjunction with the accompanying drawings and with reference to the following specific implementations. Throughout the drawings, the same or similar reference numbers refer to the same or similar elements. It should be understood that the drawings are schematic and the components and elements are not necessarily drawn in a scale.

DETAILED DESCRIPTION

Figure 1A:
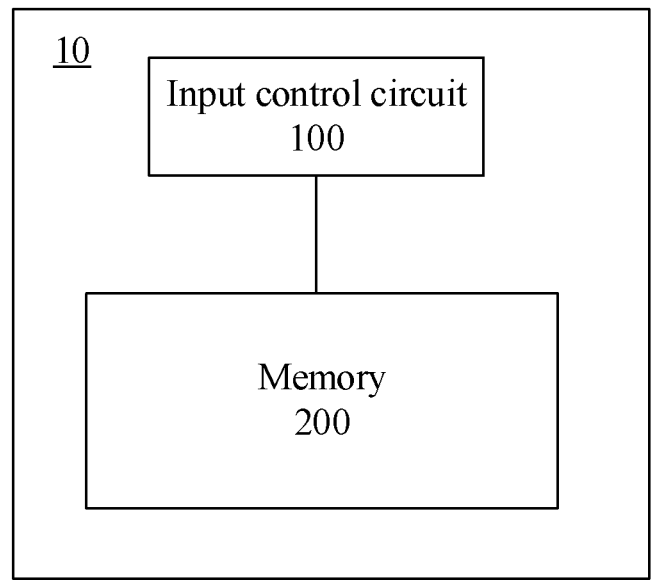
FIG. 1A is a schematic diagram of a storage circuit provided by at least one embodiment of the present disclosure.

Embodiments of the present disclosure will be described in more detail below with reference to the accompanying drawings. Although the drawings show certain embodiments of the present disclosure, it should be understood, however, that the present disclosure may be implemented in various forms and should not be construed as limited to the embodiments set forth herein, but rather these embodiments are provided for a thorough and complete understanding of the present disclosure. It should be understood that the drawings and embodiments of the present disclosure are only for exemplary purposes, and are not intended to limit the protection scope of the present disclosure.

It should be understood that the various steps described in the method embodiments of the present disclosure may be performed in different orders and/or in parallel. In addition, the method embodiments may include additional steps and/or omit performing the illustrated steps. The protection scope of the present disclosure is not limited in this regard.

The term "comprising" used in the present disclosure and variations thereof are open-ended, i.e., "comprising but not limited to". The term "based on" is "based at least in part on." The term "one embodiment" means "at least one embodiment"; the term "another embodiment" means "at least one additional embodiment"; the term "some embodiments" means "at least some embodiments." Relevant definitions of other terms will be given in the description below.

It should be noted that concepts such as "first" and "second" mentioned in the present disclosure are only used to distinguish different devices, modules, or units, and are not intended to limit the order or interdependence relationship of functions performed by these devices, modules, or units.

It should be noted that the modifications of "a" and "a plurality" mentioned in the present disclosure are illustrative and not restrictive, it should be understood by those skilled in the art that unless otherwise expressly stated in the context, it should be understood as "one or more".

The names of messages or information interacted between a plurality of devices in the embodiments of the present disclosure are only for illustrative purposes, and are not intended to limit the scope of these messages or information.

It is found that the core of the anti-aging design of the cache from the architecture level is to keep the duty cycle of the SRAM unit storing data at 50%. However, the existing technical structure is complex and requires a large change to the cache, which brings a large area overhead.

At least one embodiment of the present disclosure provides a storage circuit, a chip, a data processing method, and an electronic device. The storage circuit includes an input control circuit and a memory. The input circuit is configured to receive n input data and an input control signal; perform first data processing on the n input data based on the input control signal to obtain n intermediate data corresponding to the n input data one by one; write the n intermediate data and a sign signal corresponding to the n input data into the memory; the memory is configured to store the n intermediate data and the sign signal. Different values of the sign signal represent different processing processes of the first data processing, respectively, and n is a positive integer.

In the storage circuit provided by the embodiment of the present disclosure, the first data processing is performed on the input data based on the input control signal to obtain the intermediate data, so that the intermediate data stored in the memory can meet the needs of the user. For example, in a case where the memory is the cache, based on the input control signal, the input data stored in the cache is continuously inverted, so as to ensure that the duty cycle of the data stored in the cache is close to or equal to 50%, thereby delaying the aging of the cache, effectively reducing the influence of the aging effect on the cache, greatly prolonging the service life of the cache, and reducing the design overhead. In addition, the type of the first data processing is identified by the sign signal, so that when the intermediate data is output, the intermediate data can be processed based on the sign signal to obtain accurate output data (e.g., the same as the input data).

The embodiments of the present disclosure will be described in detail below with reference to the drawings, but the present disclosure is not limited to these specific embodiments. In order to keep the following description of the embodiments of the present disclosure clear and concise, the detailed description of some known functions and known components is omitted in the present disclosure.

Figure 1B:
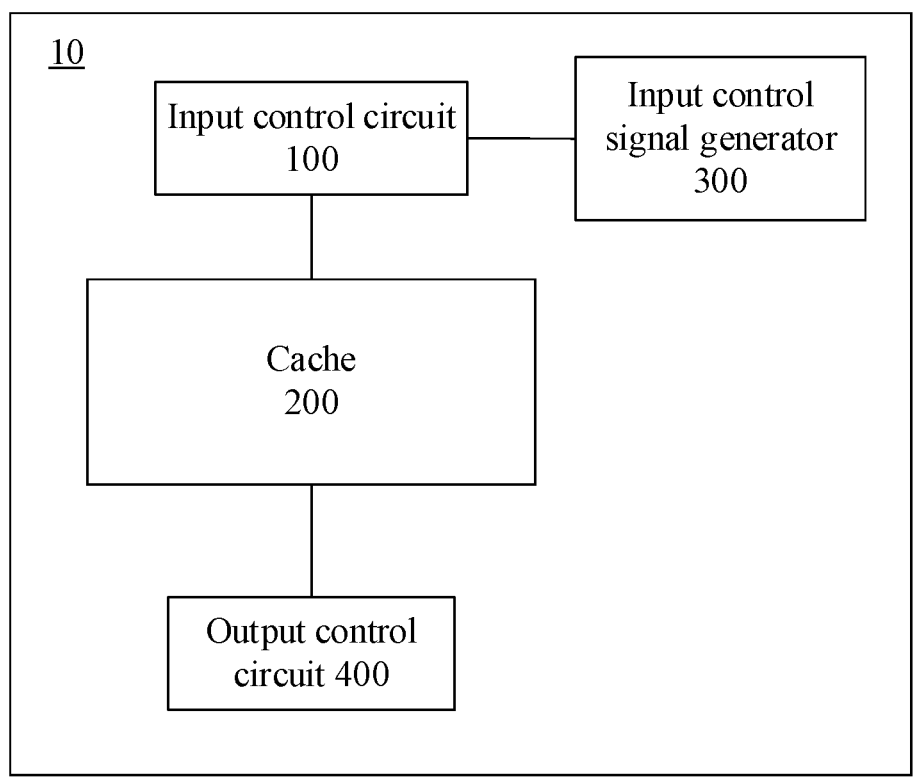
FIG. 1B is a schematic diagram of another storage circuit provided by at least one embodiment of the present disclosure.

FIG. 1A is a schematic diagram of a storage circuit provided by at least one embodiment of the present disclosure; FIG. 1B is a schematic diagram of another storage circuit provided by at least one embodiment of the present disclosure.

As shown in FIG. 1A, in some embodiments of the present disclosure, the storage circuit 10 includes an input control circuit 100 and a memory 200. For example, the memory 200 may be a cache, such as L1 Cache and L2 Cache. It should be noted that the memory 200 may also be other types of memory, and the present disclosure does not specifically limit the type of the memory 200.

For example, the input control circuit 100 is configured to receive n input data and an input control signal; perform first data processing on the n input data based on the input control signal to obtain n intermediate data corresponding to the n input data one by one; write the n intermediate data and a sign signal corresponding to the n input data into the memory 200. The memory 200 is configured to store the n intermediate data and the sign signal. For example, different values of the sign signal respectively represent different processing processes of the first data processing, and n is a positive integer.

For example, each input data may be one-bit (1 bit) data, for example, each input data may be a binary number, and the value of each input data may be a binary number of 1 or 0. It should be noted that the present disclosure is not limited to this, and each input data may be two-bit data (i.e., 2 bits), three-bit data (i.e., 3 bits), or the like.

For example, in some embodiments, the input control circuit 100 is further configured to determine a sign signal corresponding to the n input data based on the input control signal.

For example, in some embodiments, the input control signal may be one-bit data (i.e., 1 bit), and the sign signal may also be one-bit data. The input control signal and the sign signal may be binary numbers, for example, the input control signal may be 0 or 1, and the sign signal may also be 0 or 1. However, the present disclosure is not limited to this case, and the input control signal and the sign signal may also be two-bit data (i.e., 2 bits), three-bit data (i.e., 3 bits), etc. For example, the input control signal may be 00, 01, 10, or 11, and the sign signal may also be 00, 01, 10, or 11. In addition, the input control signal and the sign signal may also be ternary numbers, quaternary numbers, or decimal numbers. The present disclosure does not limit the specific forms and values of the input control signal and the sign signal.

For example, in some examples, the sign signal is the same as the input control signal, that is, the input control circuit 100 directly inputs the input control signal into the memory 200 as the sign signal. In this case, if the input control signal is 1, the sign signal is 1; if the input control signal is 0, the sign signal is 0. For example, in other examples, the sign signal and the input control signal may be different from each other, such as inverted from each other, that is, the input control circuit 100 may perform inverse processing on the input control signal to obtain the sign signal. In this case, if the input control signal is 1, the sign signal is 0; if the input control signal is 0, the sign signal is 1. It should be noted that the embodiments of the present disclosure are described by taking a case that the input control signal and the sign signal are the same and both are one-bit data as an example.

For example, as shown in FIG. 1B, the storage circuit 10 further includes an input control signal generator 300. The input control signal generator 300 is configured to generate the input control signal and output the input control signal to the input control circuit 100. In the storage circuit provided by the present embodiment, the input control signal generator 300 located outside the memory 200 generates the input control signal, and the first data processing is controlled to be performed on the input data based on the input control signal. The method to obtain the input control signal is simple and flexible, and the input control signal generator 300 outputs the input control signals meeting different requirements, so that different data processing on the input data can be implemented, which is convenient to achieve different design requirements.

For example, the different values of the sign signal are values randomly generated, and the different values of the sign signal include a first value and a second value. The first value may be 1, and the second value may be 0, so that the sign signal may be a random number sequence consisting of 0 and 1. For example, the sign signal may be represented as 0011010110110110010 . . . . For example, on the whole, such as in the whole life cycle of the cache, the ratio of the first value of the sign signal to the second value of the sign signal is within a predetermined range, and the predetermined range may be 2/3~3/2, so that in the random number sequence of the sign signal, the ratio of the number of the first values in the random number sequence to the total number of values in the random number sequence (that is, the number of data (one bit) included in the random number sequence) may be 40%~60%. The embodiments of the present disclosure are described by taking a case that the first value is 1 and the second value is 0 as an example.

For example, in some embodiments, the sign signal is a one-bit random number sequence in which the first value and the second value randomly appear, and the change interval between adjacent two values in the sign signal is 1 minute. That is, the change of the sign signal may be that: the value of the sign signal is the first value during the first minute, the value of the sign signal is the second value during the second minute, the value of the sign signal is the second value during the third minute, the value of the sign signal is the first value during the fourth minute, and so on. The duty cycle of this random number sequence is about 50%, that is, the value of the sign signal is the first value during 50% of the whole life cycle of the cache.

For example, because the input control signal is the same as the sign signal, that is, different values of the input control signal may also include the first value and the second value, the ratio of the first value of the input control signal to the second value of the input control signal is within a predetermined range on the whole, that is, in the whole life cycle of the cache. The input control signal generator 300 may randomly output a value of the input control signal every minute, that is, during the first minute, the input control signal generator 300 may output the first value, and the value of the input control signal is the first value at this time; during the second minute, the input control signal generator 300 may output the second value, and the value of the input control signal is the second value at this time; during the third minute, the input control signal generator 300 may output the second value; and during the fourth minute, the input control signal generator 300 may output the first value, and so on. For example, within a period of one month, the ratio of the first value of the input control signal to the second value of the input control signal is within the predetermined range.

It should be noted that the present disclosure does not limit the specific value of the input control signal generated by the input control signal generator 300 in each time period. For example, the input control signal generator 300 may output the first value from the first minute to the tenth minute (or from the first minute to the sixtieth minute, etc.), that is, the value of the input control signal is the first value at this time; and the input control signal generator 300 may output the second value from the eleventh minute to the twenty-fifth minute (or from the sixtieth minute to the eighty-fifth minute), that is, the value of the input control signal is the second value at this time, etc. The input control signal generator 300 randomly generates the first value or the second value, as long as the ratio of the first value of the input control signal to the second value of the input control signal is within the predetermined range on a whole (during the life cycle of the cache).

For example, the input control signal may be directly generated by a random number generation unit in the chip, that is, the input control signal generator 300 may be a random number generation unit in the chip.

For example, the value of the sign signal being the first value indicates that the first data processing is inverse processing; the value of the sign signal being the second value indicates that the first data processing is hold processing, and the processing process of the inverse processing is different from that of the hold processing. That is, when the value of the input control signal is the first value, the first data processing is the inverse processing, and when the value of the input control signal is the second value, the first data processing is the hold processing. In this case, when performing the step of performing the first data processing on the n input data based on the input control signal to obtain the n intermediate data corresponding to the n input data one by one, the input control circuit 100 performs the following steps: in response to the value of the input control signal being the first value, performing the inverse processing on the n input data to obtain the n intermediate data; in response to the value of the input control signal being the second value, performing the hold processing on the n input data to obtain the n intermediate data, that is, directly taking the n input data as the n intermediate data.

For example, in the embodiments of the present disclosure, the intermediate data obtained by performing inverse processing on the input data is different from the input data, while the intermediate data obtained by performing hold processing on the input data is the same as the input data. Taking the input data being binary data as an example, the inverse processing means that: if the input data is 1, the intermediate data obtained by performing the inverse processing on the input data is 0, and if the input data is 0, the intermediate data obtained by performing the inverse processing on the input data is 1. The hold processing means that: if the input data is 1, the intermediate data obtained by performing the hold processing on the input data is 1; if the input data is 0, the intermediate data obtained by performing the hold processing on the input data is 0.

It should be noted that the present disclosure is not limited to the above-described case. In some embodiments, the value of the sign signal being the first value indicates that the first data processing is mapping processing based on a first mapping table; the value of the sign signal being the second value indicates that the first data processing is mapping processing based on a second mapping table, and the processing process of the mapping processing based on the first mapping table is different from the processing process of the mapping processing based on the second mapping table. For example, in some embodiments, the input data may be a 2-bit binary number, and the mapping processing based on the first mapping table means that: mapping data 00 to data 11, mapping data 01 to data 10, mapping data 10 to data 01, and mapping data 11 to data 00. The mapping processing based on the second mapping table means that: mapping data 00 to data 00, mapping data 01 to data 01, mapping data 10 to data 10, and mapping data 11 to data 11. In this case, when the input data is 00, the intermediate data obtained by performing the mapping processing on the input data based on the first mapping table is 11, while the intermediate data obtained by performing the mapping processing on the input data based on the second mapping table is 00.

In addition, in addition to the first value and the second value, the different values of the sign signal may also include a third value, etc., and the embodiments of the present disclosure do not specifically limit the number of the different values. For example, the value of the sign signal being the third value indicates that the first data processing is the mapping processing based on a third mapping table; the processing process of the mapping processing based on the third mapping table is different from the processing process of the mapping processing based on the first mapping table and the processing process of the mapping processing based on the second mapping table.

For example, as shown in FIG. 1B, the storage circuit 10 further includes an output control circuit 400. The output control circuit 400 is configured to read the n intermediate data and the sign signal from the memory 200; perform second data processing on the n intermediate data based on the sign signal to obtain n output data corresponding to the n intermediate data one by one; outputting the n output data.

For example, the value of the sign signal being the first value indicates that the second data processing is the inverse processing; the value of the sign signal being the second value indicates that the second data processing is the hold processing. At this time, when performing the second data processing on the n intermediate data based on the sign signal to obtain the n output data corresponding to the n intermediate data one by one, the output control circuit 400 performs the following steps: performing inverse processing on the n intermediate data to obtain the n output data in response to the value of the sign signal being the first value; performing hold processing on the n intermediate data to obtain the n output data in response to the value of the sign signal being the second value, that is, directly taking the n intermediate data as the n output data in response to the value of the sign signal being the second value.

For example, the n input data are the same as the n output data, thus ensuring that the output data is the same as the input data stored in the memory. For example, if n is 10 and then input data are 0110001010, then then output data are 0110001010.

Figure 2:
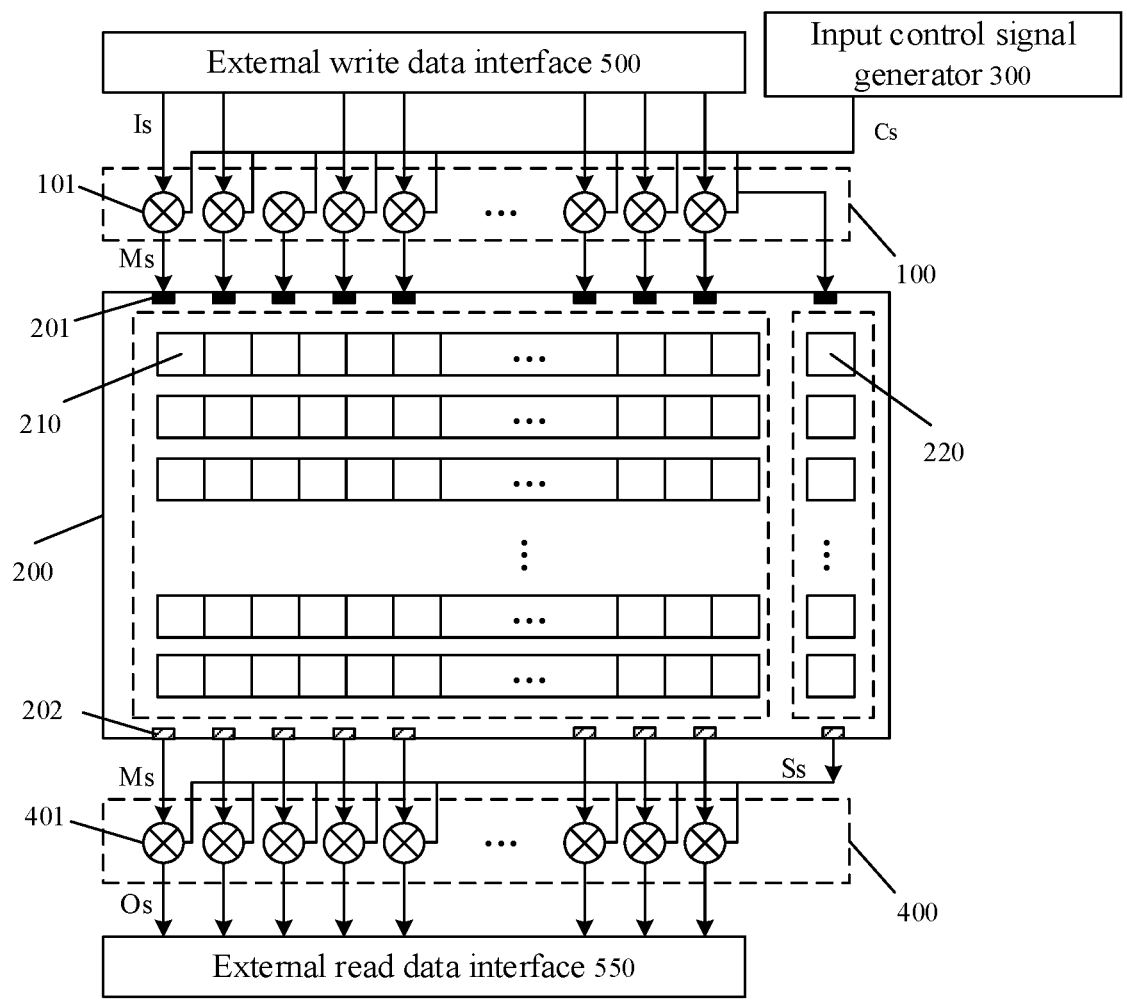
FIG. 2 is a schematic structural diagram of a storage circuit provided by some embodiments of the present disclosure.

FIG. 2 is a schematic structural diagram of a storage circuit provided by some embodiments of the present disclosure.

For example, as shown in FIG. 2, the input control circuit 100 includes n input sub-circuits 101 that are in one-to-one correspondence to the n input data. The memory 200 also includes a write data interface and an output data interface. The write data interface includes n write data bits 201 corresponding to the n input sub-circuits one by one. For example, each black rectangular block in FIG. 2 represents one write data bit 201.

For example, for each input sub-circuit 101 of the n input sub-circuits 101, a first input terminal of the input sub-circuit 101 receives one input data Is corresponding to the input sub-circuit 101, a second input terminal of the input sub-circuit 101 receives the input control signal Cs, and an output terminal of the input sub-circuit 101 is connected to a write data bit 201, corresponding to the input sub-circuit 101, in the write data interface. Each input sub-circuit 101 is configured to perform first data processing on the input data Is based on the input control signal Cs to obtain intermediate data Ms corresponding to the input data Is, and write the intermediate data Ms into the write data bit 201. For example, in the example shown in FIG. 2, the input control signal Cs is directly input to the memory 200 as the sign signal corresponding to the input data.

For example, as shown in FIG. 2, the output control circuit 400 includes n output sub-circuits 401 that are in one-to-one correspondence to then intermediate data, and the output data interface includes n output data bits 202 corresponding to the n output sub-circuits 401 one by one. For example, each rectangular block with oblique lines in FIG. 2 represents one output data bit 202.

For example, for each output sub-circuit 401 of the n output sub-circuits 401, a first input terminal of the output sub-circuit 401 is connected to an output data bit 202, corresponding to the output sub-circuit 401, in the output data interface to receive one corresponding intermediate data Ms, a second input terminal of the output sub-circuit 401 receives the sign signal Ss, and an output terminal of the output sub-circuit 401 is used to output the output data Os corresponding to the intermediate data Ms. Each output sub-circuit 401 is configured to perform the second data processing on the intermediate data Ms based on the sign signal Ss to obtain the output data Os corresponding to the intermediate data Ms, and output the output data Os.

It should be noted that in the embodiments of the present disclosure, the first data processing and the second data processing can be any suitable processing as long as the duty cycle of the cache storing the data is guaranteed to be close to or equal to 50%, and the present disclosure is not particularly limited to this. The above description about the first data processing is also applicable to the second data processing when there is no contradiction.

For example, each input sub-circuit 101 includes an XOR gate (exclusive-OR gate), the XOR gate includes two input terminals and one output terminal. In this case, if the value of the input control signal is the first value, that is, 1, when the input data is 1, the intermediate data, corresponding to the input data, output by the input sub-circuit 101 is 0, and when the input data is 0, the intermediate data, corresponding to the input data, output by the input sub-circuit 101 is 1, thereby implementing the inverse processing on the input data. If the value of the input control signal is the second value, that is, 0, when the input data is 1, the intermediate data, corresponding to the input data, output by the input sub-circuit 101 is 1, and when the input data is 0, the intermediate data, corresponding to the input data, output by the input sub-circuit 101 is 0, thereby implementing the hold processing on the input data.

For example, each output sub-circuit 401 includes an XOR gate, and the XOR gate includes two input terminals and one output terminal. In this case, if the value of the sign signal is the first value, that is, 1, when the intermediate data is 1, the output data, corresponding to the intermediate data, output by the output sub-circuit 401 is 0, and when the intermediate data is 0, the output data, corresponding to the intermediate data, output by the output sub-circuit 401 is 1, thereby implementing the inverse processing on the intermediate data. If the value of the sign signal is the second value, that is, 0, when the intermediate data is 1, the output data, corresponding to the intermediate data, output by the output sub-circuit 401 is 1, and when the intermediate data is 0, the output data, corresponding to the intermediate data, output by the output sub-circuit 401 is 0, thereby implementing the hold processing on the input data.

It should be noted that the present disclosure is not limited to this, and the input sub-circuit 101 may also be implemented as an XNOR gate (exclusive NOR gate), etc., in this case, the first value of the input control signal is 0, and the second value of the input control signal is 1. The output sub-circuit 401 may also be implemented as an XNOR gate, in this case, the first value of the sign signal is 0 and the second value of the sign signal is 1. The input sub-circuit 101 and/or the output sub-circuit 401 may also be implemented as other circuit structures, as long as the above functions can be achieved.

For example, the memory 200 may be a cache, as shown in FIG. 2, the cache includes a plurality of data static memories 210 and a plurality of sign static memories 220. The n intermediate data Ms are stored in the n corresponding data static memories 210 among the plurality of data static memories 210, and the sign signal Ss is stored in a corresponding sign static memory 220 among the plurality of sign static memories 220.

For example, when the input control circuit 100 performs the step of writing the n intermediate data and the sign signal into the memory 200, the input control circuit 100 performs following operations: acquiring a first write address corresponding to the n input data and a second write address corresponding to the sign signal; determining n data static memories based on the first write address; determining a sign static memory based on the second write address; writing the n intermediate data into the n data static memories in one-to-one correspondence, and writing the sign signal into the sign static memory.

For example, when the output control circuit 400 performs the step of reading the n intermediate data and the sign signal, the output control circuit 400 performs the following operations: acquiring a first read address corresponding to the n intermediate data and a second read address corresponding to the sign signal; determining the n data static memories for storing the n intermediate data based on the first read address; determining a sign static memory for storing the sign signal based on the second read address; reading the n intermediate data from the n data static memories, and reading the sign signal from the sign static memory.

For example, the first read address and the first write address are the same, and the second read address and the second write address are the same.

For example, the plurality of data static memories 210 and the plurality of sign static memories 220 constitute a plurality of static memory rows, and the n data static memories and the sign static memory are located in the same static memory row. For example, in some embodiments, the n data static memories and the sign static memory may constitute one static memory row, in this case, the number of the static memories in each static memory row is n+1, and each static memory row is used to store the n intermediate data and the sign signal. In other embodiments, the n data static memories and the sign static memory may be part of the static memories in one static memory row, for example, each static memory row may include (2n+2) static memories, and in this case, each static memory row includes 2n data static memories and 2 sign static memories. The present disclosure does not limit the number and arrangement of data static memories and sign static memories in the memory 200.

For example, the number of data static memories in each static memory row and the number of sign static memories in each static memory row are determined by hardware. For example, in some embodiments, the static memory row includes 64 data static memories and 2 sign static memories, and 32 input data may be written into the first data static memory to the 32nd data static memory at the same time, then the data stored in the first data static memory to the 32nd data static memory corresponds to a sign signal, and the sign signal is stored in one sign static memory of the 2 sign static memories in the static memory row. Another 32 input data are written into the 33rd data static memory to the 64th data static memory at the same time, then the data stored in the 33rd data static memory to the 64th data static memory corresponds to a sign signal, and the sign signal is stored in the other sign static memory of the 2 sign static memories in the static memory row.

For example, as shown in FIG. 2, the storage circuit 10 further includes an external write data interface 500 and an external read data interface 550. The external write data interface 500 is configured to output the n input data Is to the input control circuit 100, and the external read data interface 550 is configured to receive the n output data Os output from the output control circuit 400.

In the existing cache, each static memory row only includes a plurality of static memories for storing input data. Compared with the existing cache, each static memory row of the cache provided by the embodiments of the present disclosure may include a plurality of static memories (i.e., data static memories) for storing input data, and may further include at least one static memory (i.e., sign static memory) for storing the sign signal corresponding to the input data.

For example, assuming that each static memory row of the cache includes n static memories, that is, each static memory row may store n bits of data, that is, n input data, and the data simultaneously written into the cache or the data simultaneously output from the cache is also n bits, then the input control circuit 100 includes n XOR gates, each of which has two input terminals, and the output control circuit 400 also includes n XOR gates, each of which has two input terminals.

In the input control circuit 100, the first input terminal of each XOR gate is connected to the corresponding bit of the external write data interface 500, and the output terminal of each XOR gate is connected to the corresponding write data bit 201 in the write data interface of the cache, that is, the first input terminal of the i-th XOR gate is connected to the i-th bit of the external write data interface 500, and the output terminal of the i-th XOR gate is connected to the i-th write data bit 201 in the write data interface of the cache, the second input terminals of all XOR gates receive the input control signal. When the value of the input control signal is the first value, the input data is inverted and then written into the cache. For example, if the input data is 1 (high level), the intermediate data actually input into the cache is 0 (low level) after processing the input data through the XOR gate. When the value of the input control signal is the second value, the input data is written into the cache as it is. For example, if the input data is 1 (high level), the intermediate data actually input into the cache is 1 (high level) after processing the input data through the XOR gate.

For example, in the output control circuit 400, the first input terminal of each XOR gate is connected to the corresponding output data bit 202 in the output data interface of the cache, the output terminal of each XOR gate is connected to the corresponding bit in the external read data interface 550, and the second input terminal of each XOR gate is used for receiving the sign signal output by the cache (for example, the sign signal may also be output to the output control circuit 400 through an output data bit 202), that is, the output terminal of the i-th XOR gate is connected to the i-th bit in the external read data interface 550, the first input terminal of the i-th XOR gate is connected to the i-th output data bit 202 of the cache, and the second input terminals of all the XOR gates receive the sign signal.

For example, in the cache provided by the embodiments of the present disclosure, a static memory for storing the sign signal is added to record whether the data corresponding to the sign signal is inverted. For example, each static memory row in the original cache includes n static memories, and after adding the static memory for storing the sign signal, each static memory row includes (n+1) static memories. When the value of the sign signal is the first value, it means that all the data corresponding to the sign signal are stored after being inverted; when the value of the sign signal is the second value, it means that all the data corresponding to the sign signal remains in the original state.

Therefore, in the embodiments of the present disclosure, according to the different values of the input control signal, the data written into the cache from the external write data interface 500 is inverted or remains as it is, and then is stored in the corresponding data static memory of the cache, while the sign signal corresponding to the data is stored in the sign static memory, and the sign signal is used to indicate whether the data stored in the cache is inverted or not. When reading the stored data from the cache, according to the sign signal corresponding to the data to be read, if the data to be read is inverted, the data is inverted again and then output to the external read data interface 550; if the data to be read is not inverted, the data is directly output to the external read data interface 550.

Assuming that before the anti-aging treatment is performed on the cache, during the lifetime of the cache, the duty cycle of a certain static memory in the cache storing the data is x, based on the storage circuit provided by the embodiment of the present disclosure, because the sign signal is a random number sequence with a duty cycle of 50%, the duty cycle of the static memory in the cache is adjusted to 50%*x+50%*(1−x)=50%, thereby achieving the goal that the duty cycle of each static memory in the cache storing the data reaches 50%, reducing the influence of aging on the cache, and prolonging the service life of the cache. In the embodiment of the present disclosure, for the binary data, the "duty cycle" indicates the ratio of the time during which the static memory stores the binary data 1 in a unit time to the unit time. The duty cycle is usually less than 1. The "unit time" can be set according to actual needs, and can be one day, two days, one month, one year, the lifetime of the static memory, etc.

In the storage circuit provided by the embodiment of the present disclosure, only an additional static memory is added to the cache to record the sign signal, and compared with using a multi-bit error-correcting code to check and correct the bits with errors (seven-bit error-correcting code is required to correct one bit of erroneous data), the use of error-correcting code is reduced, which greatly reduces the design cost, and at the same time, the cache consistency of the cache will not be affected, the external interface does not need to be changed, and the cache can be read and written directly, so that the compatibility is good.

It should be noted that in the present disclosure, the input control circuit 100, the memory 200, the input control signal generator 300, the output control circuit 400, etc. in the storage circuit 10 may be implemented by hardware circuits, for example, the hardware circuits may include resistors, capacitors, diodes, triodes, and other elements.

Figure 3:
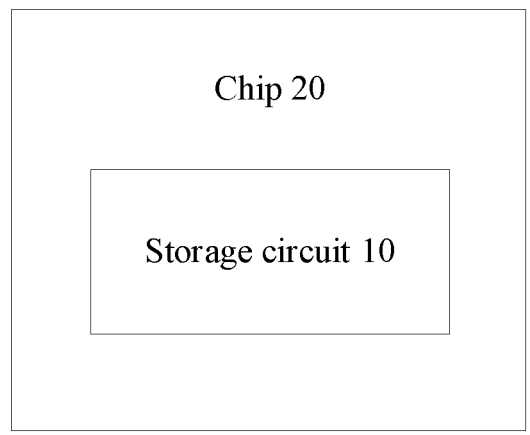
FIG. 3 is a schematic diagram of a chip provided by at least one embodiment of the present disclosure.

FIG. 3 is a schematic diagram of a chip provided by at least one embodiment of the present disclosure.

As shown in FIG. 3, some embodiments of the present disclosure also provide a chip 20, the chip 20 is an integrated circuit, and the chip 20 includes the storage circuit 10 described in any one of the above embodiments.

For example, in some embodiments, the chip 20 further includes a substrate, and the storage circuit 10 is disposed on the substrate. For example, the substrate may be a semiconductor wafer.

For example, the chip 20 may be integrated inside the central processing unit (CPU) or on the motherboard.

For the technical effects that can be achieved by the chip 20, reference may be made to the relevant descriptions in the above-mentioned embodiments of the storage circuit, and the repetitions will not be repeated here.

Figure 4:
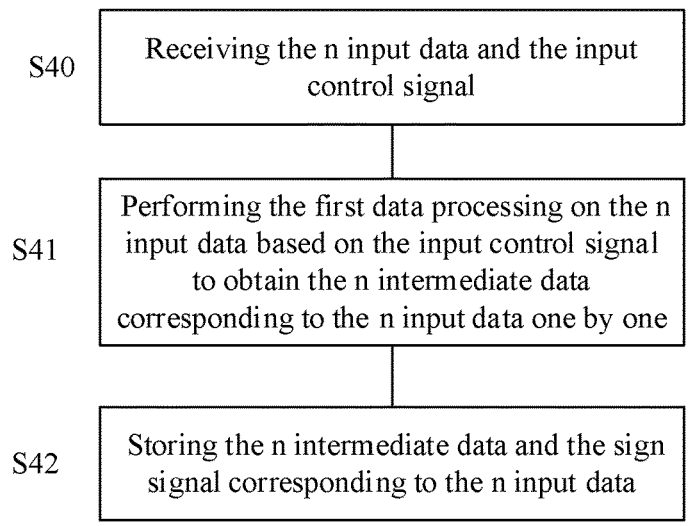
FIG. 4 is a flowchart of a data processing method provided by at least one embodiment of the present disclosure.

FIG. 4 is a flowchart of a data processing method provided by at least one embodiment of the present disclosure.

For example, the data processing method provided by the present disclosure may be applied to the storage circuit 10 described in any of the above embodiments. As shown in FIG. 4, the data processing method includes the following steps S40 to S42.

S40: receiving the n input data and the input control signal.

S41: performing the first data processing on the n input data based on the input control signal to obtain the n intermediate data corresponding to the n input data one by one.

S42: storing the n intermediate data and the sign signal corresponding to the n input data.

For example, different values of the sign signal respectively represent different processing processes of the first data processing, and n is a positive integer.

For example, in some embodiments, the data processing method further includes determining the sign signal based on the input control signal. The different values of the sign signal include a first value and a second value.

For example, performing the first data processing on the n input data based on the input control signal to obtain the n intermediate data corresponding to the n input data one by one, includes: inverting the n input data to obtain the n intermediate data in response to a value of the sign signal determined based on the input control signal being the first value; taking the n input data as the n intermediate data in response to the value of the sign signal determined based on the input control signal being the second value.

For example, in some embodiments, the data processing method further includes: reading the n intermediate data and the sign signal; performing second data processing on the n intermediate data based on the sign signal to obtain n output data corresponding to the n intermediate data one by one; and outputting the n output data.

For example, when the different values of the sign signal include the first value and the second value, performing the second data processing on the n intermediate data based on the sign signal to obtain the n output data corresponding to the n intermediate data one by one, includes: inverting the n intermediate data to obtain the n output data in response to a value of the sign signal being the first value; taking the n intermediate data as the n output data in response to the value of the sign signal being the second value.

For the technical effects that can be achieved by the data processing method, reference may be made to the relevant descriptions in the above-mentioned embodiments of the storage circuit, and the repetitions will not be repeated here.

Figure 5:
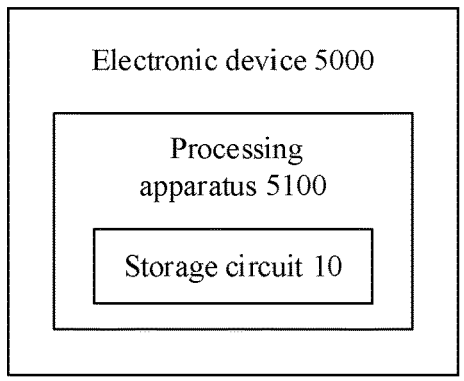
FIG. 5 is a schematic diagram of an electronic device provided by at least one embodiment of the present disclosure.

FIG. 5 is a schematic diagram of an electronic device provided by at least one embodiment of the present disclosure.

As shown in FIG. 5, some embodiments of the present disclosure also provide an electronic device 5000. The electronic device 5000 includes a processing apparatus 5100, and the processing apparatus 5100 includes the storage circuit 10 described in any of the above embodiments.

For example, the processing apparatus 5100 may be a central processing unit (CPU), a graphics processor (GPU), or the like. The storage circuit 10 may be integrated inside the CPU. The processing apparatus 5100 may also be other forms of processing units with data processing capability and/or program execution capability, such as a field programmable gate array (FPGA), a tensor processing unit (TPU), or the like. For example, the CPU may have X86 or ARM architecture, etc.

For the technical effects that can be achieved by the electronic device 5000, reference may be made to the relevant descriptions in the above-mentioned embodiments of the storage circuit, and the repetitions will not be repeated here.

Figure 6:
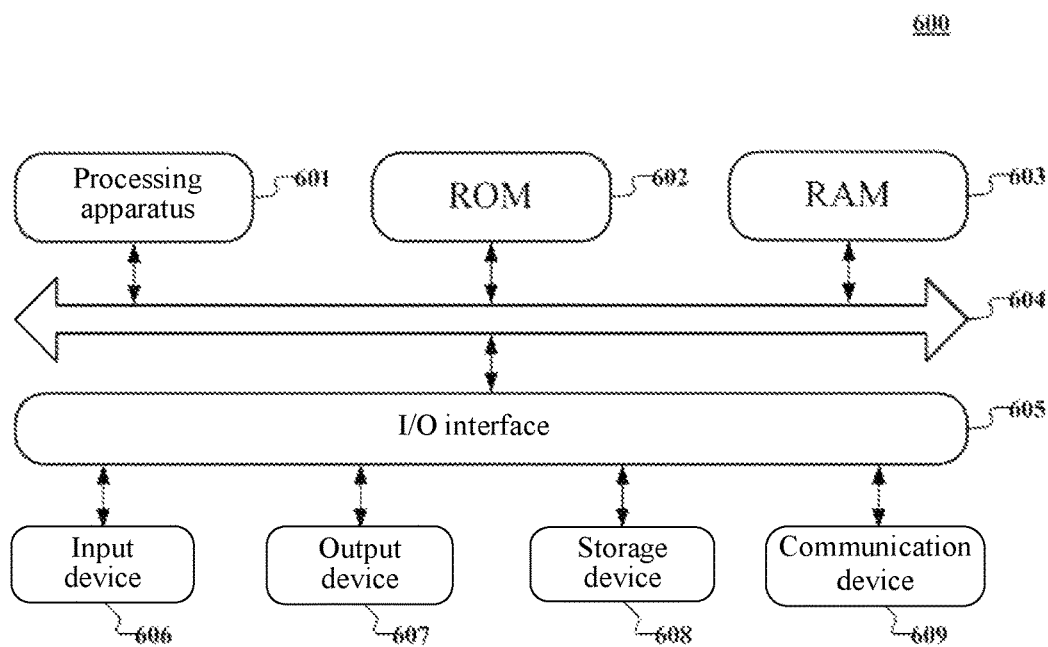
FIG. 6 is a schematic structural diagram of an electronic device provided by at least one embodiment of the present disclosure.

Referring to FIG. 6 below, FIG. 6 shows a schematic structural diagram of an electronic device 600 suitable for implementing the embodiment of the present disclosure. The electronic device in the embodiments of the present disclosure may include, but is not limited to, mobile terminals such as a mobile phone, a notebook computer, a digital broadcast receiver, a PDA (personal digital assistant), a PAD (portable android device, namely tablet computer), a PMP (portable multimedia player), a vehicle-mounted terminal (e.g., vehicle-mounted navigation terminal), a wearable electronic device, etc., and fixed terminals such as a digital TV, a desktop computer, a smart home device, etc. The electronic device shown in FIG. 6 is only an example, and should not impose any limitation to the functions and application scope of the embodiments of the present disclosure.

For example, the storage circuit 10 provided by the present disclosure may be provided in the electronic device 600.

As shown in FIG. 6, the electronic device 600 may include a processing apparatus (e.g., a central processing unit, a graphics processing unit, etc.) 601, which can perform various suitable actions and processing according to a program stored in a read-only memory (ROM) 602 or a program loaded from a storage device 608 into a random access memory (RAM) 603. The RAM 603 further stores various programs and data required for operations of the electronic device 600. The processing apparatus 601, the ROM 902, and the RAM 603 are connected to each other through a bus 604. An input/output (I/O) interface 605 is also connected to the bus 604.

Usually, the following devices may be connected to the I/O interface 605: an input device 606 including, for example, a touch screen, a touch pad, a keyboard, a mouse, a camera, a microphone, an accelerometer, a gyroscope, etc.; an output device 607 including, for example, a liquid crystal display (LCD), a loudspeaker, a vibrator, etc.; the storage device 608 including, for example, a magnetic tape, a hard disk, etc.; and a communication device 609. The communication unit 609 may allow the electronic device 600 to communicate wirelessly or by wire with other devices to exchange data. Although FIG. 6 illustrates the electronic device 900 having various devices, it is to be understood that all the illustrated devices are not necessarily implemented or included. More or less devices may be implemented or included alternatively.

Particularly, according to the embodiments of the present disclosure, the processes described above with reference to the flowchart may be implemented as a computer software program. For example, an embodiment of the present disclosure includes a computer program product, which includes a computer program carried on a non-transitory computer-readable medium. The computer program includes program codes for executing the method shown in the flowchart, and may be used to execute one or more steps of the data processing method in the embodiments described above. In such an embodiment, the computer program may be downloaded and installed from the network through the communication device 609, or installed from the storage device 608, or installed from the ROM 602. When the computer program is executed by the processing apparatus 601, the processing apparatus 601 can be caused to perform the above-mentioned functions defined in the data processing method of the embodiment of the present disclosure.

It should be noted that, in the context of the present disclosure, the computer-readable medium may be a tangible medium that may contain or store a program used by or used in connection with the instruction execution system, apparatus, or device. The computer-readable medium may be a computer-readable signal medium or a computer-readable storage medium or any combination thereof. For example, the computer-readable storage medium may be, but not limited to, an electric, magnetic, optical, electromagnetic, infrared, or semiconductor system, apparatus, or device, or any combination of them. More specific examples of the computer-readable storage medium may include, but are not limited to: an electrical connection having one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any appropriate combination of them. In the present disclosure, the computer-readable storage medium may be any tangible medium containing or storing a program that can be used by or used in combination with an instruction execution system, apparatus, or device. In the present disclosure, the computer-readable signal medium may include a data signal that propagates in a baseband or as a part of a carrier and carries computer-readable program codes. The data signal propagating in such a manner may take a variety of forms, including but not limited to an electromagnetic signal, an optical signal, or any appropriate combination thereof. The computer-readable signal medium may also be any computer-readable medium other than the computer-readable storage medium. The computer-readable signal medium may send, propagate, or transmit a program used by or used in combination with an instruction execution system, apparatus, or device. The program code contained on the computer-readable medium may be transmitted by using any suitable medium, including but not limited to an electric wire, a fiber-optic cable, radio frequency (RF), and the like, or any appropriate combination of the above media.

The above-mentioned computer-readable medium may be included in the electronic device described above, or may exist alone without being assembled into the electronic device.

Computer program codes for performing the operations in the present disclosure may be written in one or more programming languages or a combination thereof. The programming languages include but are not limited to object oriented programming languages, such as Java, Smalltalk, and C++, and also include conventional procedural programming languages, such as "C" language or similar programming languages. The program code can be executed fully on a user's computer, executed partially on a user's computer, executed as an independent software package, executed partially on a user's computer and partially on a remote computer, or executed fully on a remote computer or a server. In the scenario involving a remote computer, the remote computer may be connected to the user's computer through any type of networks including a local area network (LAN) or a wide area network (WAN), or may be connected to an external computer (e.g., connected through the Internet from an Internet Service Provider).

The flowcharts and block diagrams in the accompanying drawings illustrate system architectures, functions, and operations that may be implemented by the system, method, and computer program products according to the various embodiments of the present disclosure. In this regard, each block in the flowcharts or block diagrams may represent a module, a program segment, or a part of code, and the module, the program segment, or the part of code includes one or more executable instructions for implementing specified logic functions. It should also be noted that, in some alternative implementations, functions marked in the blocks may also occur in an order different from the order designated in the accompanying drawings. For example, two consecutive blocks can actually be executed substantially in parallel, and they may sometimes be executed in a reverse order, which depends on involved functions. It should also be noted that each block in the flowcharts and/or block diagrams and combinations of the blocks in the flowcharts and/or block diagrams may be implemented by a dedicated hardware-based system for executing specified functions or operations, or may be implemented by a combination of a dedicated hardware and computer instructions.

Related units described in the embodiments of the present disclosure may be implemented by software, or may be implemented by hardware. The name of a unit does not, in some cases, constitute a limitation on the unit itself.

The functions described above in the present disclosure may be executed at least in part by one or more hardware logic components. For example, without limitations, exemplary types of the hardware logic components that can be used include: a field programmable gate array (FPGA), an application specific integrated circuit (ASIC), an application specific standard product (ASSP), a system on chip (SOC), a complex programmable logic device (CPLD), and the like.

According to one or more embodiments of the present disclosure, a storage circuit includes: an input control circuit and a memory. The input control circuit is configured to: receive n input data and an input control signal; perform first data processing on the n input data based on the input control signal to obtain n intermediate data corresponding to the n input data one by one; and write the n intermediate data and a sign signal corresponding to the n input data into the memory; the memory is configured to store the n intermediate data and the sign signal; different values of the sign signal respectively represent different processing processes of the first data processing, and n is a positive integer.

According to one or more embodiments of the present disclosure, the storage circuit further includes an input control signal generator, the input control signal generator is configured to generate the input control signal and output the input control signal to the input control circuit.

According to one or more embodiments of the present disclosure, the sign signal is identical with the input control signal.

According to one or more embodiments of the present disclosure, the different values of the sign signal are values randomly generated.

According to one or more embodiments of the present disclosure, the different values of the sign signal comprise a first value and a second value, and a ratio of the first value to the second value is within a predetermined range.

According to one or more embodiments of the present disclosure, a value of the sign signal being the first value indicates that the first data processing is inverse processing; the value of the sign signal being the second value indicates that the first data processing is hold processing.

According to one or more embodiments of the present disclosure, the predetermined range is 2/3 to 3/2.

According to one or more embodiments of the present disclosure, the storage circuit further includes an output control circuit, the output control circuit is configured to: read the n intermediate data and the sign signal from the memory; perform second data processing on the n intermediate data based on the sign signal to obtain n output data corresponding to the n intermediate data one by one; and output the n output data.

According to one or more embodiments of the present disclosure, the different values of the sign signal comprise a first value and a second value, and a ratio of the first value to the second value is within a predetermined range, a value of the sign signal being the first value indicates that the second data processing is inverse processing; the value of the sign signal being the second value indicates that the second data processing is hold processing.

According to one or more embodiments of the present disclosure, the input control circuit comprises n input sub-circuits corresponding to the n input data one by one, the memory also comprises a write data interface and an output data interface, the write data interface comprises n write data bits corresponding to the n input sub-circuits one by one, for each input sub-circuit of the n input sub-circuits, a first input terminal of the input sub-circuit receives input data corresponding to the input sub-circuit, a second input terminal of the input sub-circuit receives the input control signal, and an output terminal of the input sub-circuit is connected to a write data bit, corresponding to the input sub-circuit, in the write data interface, and the input sub-circuit is configured to perform the first data processing on the input data based on the input control signal to obtain intermediate data corresponding to the input data, and write the intermediate data into the write data bit; the output control circuit comprises n output sub-circuits corresponding to the n intermediate data one by one, and the output data interface comprises n output data bits corresponding to the n output sub-circuits one by one, for each output sub-circuit of the n output sub-circuits, a first input terminal of the output sub-circuit is connected to an output data bit, corresponding to the output sub-circuit, in the output data interface to receive intermediate data corresponding to the output sub-circuit, a second input terminal of the output sub-circuit receives the sign signal, an output terminal of the output sub-circuit is used for outputting output data corresponding to the intermediate data, and the output sub-circuit is configured to perform the second data processing on the intermediate data based on the sign signal to obtain the output data corresponding to the intermediate data and output the output data.

According to one or more embodiments of the present disclosure, each input sub-circuit comprises an XOR gate, and each output sub-circuit comprises an XOR gate.

According to one or more embodiments of the present disclosure, the memory is a cache, the cache comprises a plurality of data static memories and a plurality of sign static memories, the n intermediate data are respectively stored in n data static memories, corresponding to the n intermediate data, of the plurality of data static memories, and the sign signal is stored in a sign static memory, corresponding to the sign signal, of the plurality of sign static memories.

According to one or more embodiments of the present disclosure, the plurality of data static memories and the plurality of sign static memories constitute a plurality of static memory rows, the n data static memories and the sign static memory are located in the same static memory row.

According to one or more embodiments of the present disclosure, the storage circuit further comprises an external write data interface, the external write data interface is configured to output the n input data to the input control circuit.

According to one or more embodiments of the present disclosure, the storage circuit further comprises an external read data interface, the external read data interface is configured to receive the n output data output from the output control circuit.

According to one or more embodiments of the present disclosure, a chip comprises the storage circuit according to any of the above embodiments.

According to one or more embodiments of the present disclosure, a data processing method is applied to the storage circuit according to any of the above embodiments. The data processing method comprises: receiving the n input data and the input control signal; performing the first data processing on the n input data based on the input control signal to obtain the n intermediate data corresponding to the n input data one by one; and storing the n intermediate data and the sign signal corresponding to the n input data. n is a positive integer.

According to one or more embodiments of the present disclosure, the data processing method further comprises: determining the sign signal based on the input control signal; the different values of the sign signal comprise a first value and a second value, performing the first data processing on the n input data based on the input control signal to obtain the n intermediate data corresponding to the n input data one by one, comprises: inverting the n input data to obtain the n intermediate data in response to a value of the sign signal determined based on the input control signal being the first value; taking the n input data as the n intermediate data in response to the value of the sign signal determined based on the input control signal being the second value.

According to one or more embodiments of the present disclosure, the data processing method further comprises: reading the n intermediate data and the sign signal; performing second data processing on the n intermediate data based on the sign signal to obtain n output data corresponding to the n intermediate data one by one; and outputting the n output data.

According to one or more embodiments of the present disclosure, the different values of the sign signal comprise a first value and a second value, performing second data processing on the n intermediate data based on the sign signal to obtain n output data corresponding to the n intermediate data one by one, comprises: inverting the n intermediate data to obtain the n output data in response to a value of the sign signal being the first value; taking the n intermediate data as the n output data in response to the value of the sign signal being the second value.

According to one or more embodiments of the present disclosure, an electronic device comprises: a processing apparatus, and the processing apparatus comprises the storage circuit according to any of the above embodiments.

The foregoing descriptions are merely the illustrations of the alternative embodiments of the present disclosure and the explanations of the technical principles involved. Those skilled in the art should understand that the scope of the present disclosure involved in the present disclosure is not limited to the technical solutions formed by a specific combination of the technical features described above, and shall also cover other technical solutions formed by any combination of the technical features described above or equivalent features thereof without departing from the concept of the present disclosure. For example, the technical features described above may be mutually replaced with the technical features having similar functions disclosed herein (but not limited thereto) to form new technical solutions.

In addition, while operations have been described in a particular order, it shall not be construed as requiring that such operations are performed in the stated particular order or in a sequential order. Under certain circumstances, multitasking and parallel processing may be advantageous. Similarly, while some specific implementation details are included in the above discussions, these shall not be construed as limitations to the scope of the present disclosure. Some features described in the context of a separate embodiment may also be implemented in combination in a single embodiment. Conversely, various features described in the context of a single embodiment may also be implemented in various embodiments individually or in a plurality of embodiments in any appropriate sub-combination.

Although the present subject matter has been described in a language specific to structural features and/or logical method acts, it will be appreciated that the subject matter defined in the appended claims is not necessarily limited to the particular features or acts described above. Rather, the particular features and acts described above are merely exemplary forms for implementing the claims.

For the present disclosure, the following statements should be noted:

(1) The accompanying drawings involve only the structure(s) in connection with the embodiment(s) of the present disclosure, and other structure(s) can refer to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element may be interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A storage circuit, comprising: an input control circuit and a memory, wherein the input control circuit is configured to:
  receive n input data and an input control signal,
  perform first data processing on the n input data based on the input control signal to obtain n intermediate data corresponding to the n input data one by one,
  write the n intermediate data and a sign signal corresponding to the n input data into the memory;
  the memory is configured to store the n intermediate data and the sign signal;
  wherein the sign signal comprises a sequence of values, different values in the sign signal respectively represent different types of data processing, and n is a positive integer;
  wherein the input control circuit comprises n input sub-circuits corresponding to the n input data one by one;
  wherein the memory comprises a write data interface and an output data interface, the write data interface comprises n write data bits corresponding to the n input sub-circuits one by one;
  wherein for each input sub-circuit of the n input sub-circuits, a first input terminal of the input sub-circuit receives input data corresponding to the input sub-circuit, a second input terminal of the input sub-circuit receives the input control signal, and an output terminal of the input sub-circuit is connected to a write data bit, corresponding to the input sub-circuit, in the write data interface; and wherein each input sub-circuit of the n input sub-circuits is configured to perform the first data processing on the input data based on the input control signal to obtain intermediate data corresponding to the input data, and write the intermediate data into the write data bit.

2. The storage circuit according to claim 1, further comprising an input control signal generator, wherein the input control signal generator is configured to generate the input control signal and output the input control signal to the input control circuit.

3. The storage circuit according to claim 1, wherein the sign signal is identical with the input control signal.

4. The storage circuit according to claim 1, wherein the different values in the sign signal are values randomly generated.

5. The storage circuit according to claim 1, wherein the different values in the sign signal comprise a first value and a second value, and a ratio of a number of the first values in the sign signal to a number of the second values in the sign signal is within a predetermined range.

6. The storage circuit according to claim 5, wherein the first value in the sign signal indicates that the first data processing is inverse processing; the second value in the sign signal indicates that the first data processing is hold processing.

7. The storage circuit according to claim 5, wherein the predetermined range is 2/3 to 3/2.

8. The storage circuit according to claim 1, further comprising an output control circuit, wherein the output control circuit is configured to:

read the n intermediate data and the sign signal from the memory;

perform second data processing on the n intermediate data based on the sign signal to obtain n output data corresponding to the n intermediate data one by one; and output the n output data.

9. The storage circuit according to claim 8, wherein the different values in the sign signal comprise a first value and a second value, and a ratio of a number of the first values in the sign signal to a number of the second values in the sign signal is within a predetermined range, the first value in the sign signal indicates that the second data processing is inverse processing; the second value in the sign signal indicates that the second data processing is hold processing.

10. The storage circuit according to claim 8, wherein the output control circuit comprises n output sub-circuits corresponding to the n intermediate data one by one, and the output data interface comprises n output data bits corresponding to the n output sub-circuits one by one, for each output sub-circuit of the n output sub-circuits, a first input terminal of the output sub-circuit is connected to an output data bit, corresponding to the output sub-circuit, in the output data interface to receive intermediate data corresponding to the output sub-circuit, a second input terminal of the output sub-circuit receives the sign signal, an output terminal of the output sub-circuit is used for outputting output data corresponding to the intermediate data, and the output sub-circuit is configured to perform the second data processing on the intermediate data based on the sign signal to obtain the output data corresponding to the intermediate data and output the output data.

11. The storage circuit according to claim 10, wherein each input sub-circuit comprises an XOR gate, and each output sub-circuit comprises an XOR gate.

12. The storage circuit according to claim 1, wherein the memory is a cache, the cache comprises a plurality of data static memories and a plurality of sign static memories, the n intermediate data are respectively stored in n data static memories, corresponding to then intermediate data, of the plurality of data static memories, and the sign signal is stored in a sign static memory, corresponding to the sign signal, of the plurality of sign static memories.

13. The storage circuit according to claim 12, wherein the plurality of data static memories and the plurality of sign static memories constitute a plurality of static memory rows, the n data static memories and the sign static memory are located in a same static memory row.

14. The storage circuit according to claim 8, further comprising an external write data interface and an external read data interface, wherein the external write data interface is configured to output the n input data to the input control circuit, and the external read data interface is configured to receive the n output data output from the output control circuit.

15. A chip, comprising a storage circuit, wherein the storage circuit comprises an input control circuit and a memory, the input control circuit is configured to:

receive n input data and an input control signal, perform first data processing on the n input data based on the input control signal to obtain n intermediate data corresponding to the n input data one by one, write the n intermediate data and a sign signal corresponding to the n input data into the memory;

the memory is configured to store the n intermediate data and the sign signal;

wherein the sign signal comprises a sequence of values, different values in the sign signal respectively represent different types of data processing, and n is a positive integer;

wherein the input control circuit comprises n input sub-circuits corresponding to the n input data one by one;

wherein the memory comprises a write data interface and an output data interface, the write data interface comprises n write data bits corresponding to the n input sub-circuits one by one;

wherein for each input sub-circuit of the n input sub-circuits, a first input terminal of the input sub-circuit receives input data corresponding to the input sub-circuit, a second input terminal of the input sub-circuit receives the input control signal, and an output terminal of the input sub-circuit is connected to a write data bit, corresponding to the input sub-circuit, in the write data interface; and wherein each input sub-circuit of the n input sub-circuits is configured to perform the first data processing on the input data based on the input control signal to obtain intermediate data corresponding to the input data, and write the intermediate data into the write data bit.

16. A data processing method applied to a storage circuit, wherein the storage circuit comprises an input control circuit and a memory, the input control circuit is configured to:
receive n input data and an input control signal,
perform first data processing on the n input data based on the input control signal to obtain n intermediate data corresponding to the n input data one by one,
write the n intermediate data and a sign signal corresponding to the n input data into the memory;
the memory is configured to store the n intermediate data and the sign signal;
wherein the sign signal comprises a sequence of values, different values of the sign signal respectively represent different types of data processing, and n is a positive integer;
wherein the input control circuit comprises n input sub-circuits corresponding to the n input data one by one;
wherein the memory comprises a write data interface and an output data interface, the write data interface comprises n write data bits corresponding to the n input sub-circuits one by one;
wherein for each input sub-circuit of the n input sub-circuits, a first input terminal of the input sub-circuit receives input data corresponding to the input sub-circuit, a second input terminal of the input sub-circuit receives the input control signal, and an output terminal of the input sub-circuit is connected to a write data bit, corresponding to the input sub-circuit, in the write data interface;
wherein each input sub-circuit of the n input sub-circuits is configured to perform the first data processing on the input data based on the input control signal to obtain intermediate data corresponding to the input data, and write the intermediate data into the write data bit;
the data processing method comprises:
receiving the n input data and the input control signal;
performing the first data processing on the n input data based on the input control signal to obtain the n intermediate data corresponding to the n input data one by one; and
storing the n intermediate data and the sign signal corresponding to the n input data.

17. The data processing method according to claim 16, further comprising: determining the sign signal based on the input control signal;

wherein the different values in the sign signal comprise a first value and a second value,
performing the first data processing on the n input data based on the input control signal to obtain the n intermediate data corresponding to the n input data one by one, comprises:
inverting the n input data to obtain the n intermediate data in response to a value in the sign signal determined based on the input control signal being the first value;
taking the n input data as the n intermediate data in response to the value in the sign signal determined based on the input control signal being the second value.

18. The data processing method according to claim 16, further comprising:
reading the n intermediate data and the sign signal;
performing second data processing on the n intermediate data based on the sign signal to obtain n output data corresponding to the n intermediate data one by one; and
outputting the n output data.

19. The data processing method according to claim 18, wherein the different values in the sign signal comprise a first value and a second value,
performing second data processing on the n intermediate data based on the sign signal to obtain n output data corresponding to the n intermediate data one by one, comprises:
inverting the n intermediate data to obtain the n output data in response to a value in the sign signal being the first value;
taking the n intermediate data as the n output data in response to the value in the sign signal being the second value.

20. The chip according to claim 15, wherein the storage circuit further comprises an output control circuit,
the output control circuit is configured to:
read the n intermediate data and the sign signal from the memory;
perform second data processing on the n intermediate data based on the sign signal to obtain n output data corresponding to the n intermediate data one by one; and
output the n output data.

* * * * *